(12) United States Patent
Kaneko et al.

(10) Patent No.: US 8,263,230 B2
(45) Date of Patent: Sep. 11, 2012

(54) CERAMIC COMPOSITION, CERAMIC GREEN SHEET, AND CERAMIC ELECTRONIC COMPONENT

(75) Inventors: Kazuhiro Kaneko, Nagaokakyo (JP); Satoshi Oga, Nagaokakyo (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

(21) Appl. No.: 13/109,482

(22) Filed: May 17, 2011

(65) Prior Publication Data
US 2011/0214908 A1 Sep. 8, 2011

Related U.S. Application Data

(63) Continuation of application No. PCT/JP2009/003402, filed on Jul. 21, 2009.

(30) Foreign Application Priority Data

Nov. 21, 2008 (JP) ................................. 2008-298258

(51) Int. Cl.
*C03C 14/00* (2006.01)
*C03C 3/064* (2006.01)
*C03C 3/089* (2006.01)
*C03C 3/091* (2006.01)
*H05K 1/09* (2006.01)
*C04B 35/465* (2006.01)
*C04B 35/47* (2006.01)
*B32B 18/00* (2006.01)

(52) U.S. Cl. .......... 428/446; 428/697; 428/702; 501/18; 501/21; 501/65; 501/66; 501/69; 501/70; 501/72; 501/77; 501/136

(58) Field of Classification Search ............... 501/18, 501/21, 32, 65, 66, 69, 70, 72, 77, 136; 428/701, 428/426, 428, 432, 469, 471
See application file for complete search history.

(56) References Cited

U.S. PATENT DOCUMENTS
6,195,250 B1 * 2/2001 Matoba et al. ............. 361/321.5
(Continued)

FOREIGN PATENT DOCUMENTS
JP 3030557 4/2000
(Continued)

OTHER PUBLICATIONS
Written Opinion of the International Searching Authority, mailed Oct. 6, 2009.

*Primary Examiner* — David Sample
(74) *Attorney, Agent, or Firm* — Dickstein Shapiro LLP

(57) ABSTRACT

A ceramic composition is prepared to contain a $B_2O_3$—$SiO_2$—$Al_2O_3$—MO based glass composition (M: Ca, Mg, Sr and/or Ba, $B_2O_3$: 4 to 17.5 weight %, $SiO_2$: 28 to 50 weight %, $Al_2O_3$: 0 to 20 weight %, and MO: 36 to 50 weight %): 24 to 40 weight %, $SrTiO_3$ and/or $CaTiO_3$: 46 to 75.4 weight %, CuO: 0.1 to 5.0 weight %, CaO: 0.5 to 7.0 weight %, and MnO, ZnO and/or CoO: 10 weight % or more (however, including 0% by weight). The ceramic composition is subjected to firing to produce a ceramic sintered body, and obtain a composite LC component including the ceramic sintered body. While suppressing the shrinkage behavior during firing, dielectric properties can be improved dramatically as compared with conventional cases, and moreover reliability can be ensured.

20 Claims, 2 Drawing Sheets

U.S. PATENT DOCUMENTS

| | | |
|---|---|---|
| 6,376,055 B1 | 4/2002 | Kishida et al. |
| 2006/0287184 A1* | 12/2006 | Mori et al. ............ 501/32 |
| 2006/0293168 A1* | 12/2006 | Mori et al. ............ 501/136 |
| 2007/0036996 A1 | 2/2007 | Sugimoto et al. |
| 2007/0128450 A1* | 6/2007 | Mori et al. ............ 428/432 |
| 2007/0237935 A1* | 10/2007 | Mori et al. ............ 428/210 |

FOREIGN PATENT DOCUMENTS

| | | |
|---|---|---|
| JP | 2000-351668 | 12/2000 |
| JP | 2006-069822 | 3/2006 |
| JP | 2006-210044 | 8/2006 |
| WO | WO-2006-046361 | 5/2006 |

* cited by examiner

CERAMIC COMPOSITION, CERAMIC GREEN SHEET, AND CERAMIC ELECTRONIC COMPONENT This is a continuation of application Serial No. PCT/JP2009/003402, filed Jul. 21, 2009, the contents of which are incorporated herein by reference.

TECHNICAL FIELD

The present invention relates to a ceramic composition, a ceramic green sheet, and a ceramic electronic component, and more particularly, to a ceramic composition for low-temperature firing, which has a high specific dielectric constant, a ceramic green sheet using the ceramic composition, and a ceramic electronic component such as a ceramic multilayer substrate and a composite LC component using the ceramic composition.

BACKGROUND ART

Dielectric ceramics for high frequency applications have been, in recent years, used widely, for example, for dielectric resonators and dielectric substrates for MIC. This type of dielectric ceramic for high frequencies have been required to provide high specific dielectric constants $\in r$ and Q values, for the reduction in size.

On the other hand, the dielectric ceramic for high frequencies are disadvantageous in that when tungsten or molybdenum with a high melting point is used for a conductor material, ceramic multilayer substrates particularly have limited high-frequency characteristics due to the high resistivities of these high melting point metals, and moreover, which are expensive. For this reason, the use of low-resistance and inexpensive low-melting-point metals such as Ag and Cu as the conductor material has been requested.

In order to obtain a ceramic sintered body by co-firing of a conductor material and a ceramic material, there is a need to subject the ceramic material to firing at a temperature which is lower than the melting points of these low-melting-point metals.

Therefore, studies have been actively carried out on ceramic materials for low-temperature firing which are composite materials, each composed of a ceramic constituent and a glass constituent, and ceramic multilayer substrates using such ceramic materials have been progressively put into practical use.

For example, Patent Document 1 proposes a ceramic raw material composition including: 10 to 45 weight % of a BaO—TiO$_2$—ReO$_{3/2}$ based ceramic composition represented by xBaO—yTiO$_2$-zReO$_{3/2}$ (where x, y, and z represent mol %; $8 \leq x \leq 18$, $52.5 \leq y \leq 65$, and $20 \leq z \leq 40$; x+y+z=100; and Re is a rare earth element); 5 to 40 weight % of alumina; and 40 to 65 weight % of a borosilicate glass composition containing 4 to 17.5 weight % of B$_2$O$_3$, 28 to 50 weight % of SiO$_2$, 0 to 20 weight % of Al$_2$O$_3$, and 36 to 50 weight % of MO (where MO is at least one selected from CaO, MgO, SrO, and BaO), in which the total amount of the BaO—TiO$_2$—ReO$_{3/2}$ based ceramic composition and the alumina is 35 weight % or more.

In Patent Document 1, the borosilicate glass contained in the composition can suppress the shrinkage behavior of the ceramics during firing, and the high glass viscosity can suppress interdiffusion to and from other low-temperature fired substrates. Furthermore, the ceramic composition can provide a ceramic raw material composition which has a high specific dielectric constant $\in r$ on the order of 15.

PRIOR ART DOCUMENT

Patent Document

Patent Document 1: WO2006/046361

DISCLOSURE OF THE INVENTION

Problem to be Solved by the Invention

While the ceramic raw material composition in Patent Document 1 has a relatively high specific dielectric constant $\in r$ on the order of 15, a higher specific dielectric constant $\in r$ has been required in order to respond to the request of further reduction in size for module products, etc., today.

In order to increase the specific dielectric constant $\in r$, there is a need to reduce the content of the glass composition and increase the content of the ceramic powder as filler. On the other hand, since the reduced content of the glass composition lowers the fluidity of the glass composition, the firing treatment makes the ceramic sintered body more likely to shrink. Therefore, in order to make it easier to control the shrinkage behavior during the firing, there is a need to increase the content of the glass composition. These contradictory considerations make it difficult to achieve a balance between the control over the shrinkage behavior of the ceramic sintered body during the firing and having a high specific dielectric constant.

The present invention has been achieved in view of this situation, and an object of the present invention is to provide a ceramic composition which can improve dielectric properties dramatically as compared with conventional cases, and moreover to ensure reliability while suppressing the shrinkage behavior during firing, as well as a ceramic green sheet and a ceramic electronic component using the ceramic composition.

Means for Solving the Problem

The inventors have carried out earnest studies in order to achieve the object, and discovered that a ceramic composition for low-temperature firing, which has favorable dielectric properties with a specific dielectric constant $\in r$ of 40 or more and a Q value of 750 or more, can be obtained while making it easier to control the shrinkage behavior of a ceramic sintered body during firing, by the addition of SrTiO$_3$ or CaTiO$_3$ with a high specific dielectric constant $\in r$ in a predetermined range in addition to borosilicate glass which has a specified composition, and further by a specific sintering aid constituent contained in the range of not more than a predetermined amount.

More specifically, the glass composition itself generates a liquid phase to act as a sintering aid for promoting grain-grain sintering, the increased content of the glass composition makes, because of its low specific dielectric constant $\in r$, it difficult to obtain a ceramic composition with a desired high specific dielectric constant, even when SrTiO$_3$ or CaTiO$_3$ with a high specific dielectric constant $\in r$ is added.

However, the inventors discovered that the liquid-phase sintering action of the glass composition is promoted by the addition of Cu oxide and Ca oxide as sintering aids and further, if necessary, the addition of respective oxides of Mn, Co, and Zn. Furthermore, as a result, it has been determined that the firing carried out with the addition of SrTiO$_3$ or CaTiO$_3$ can, even in the case of low-temperature firing, provide a ceramic composition which is excellent in various types of dielectric properties and reliability while making it easier to control the shrinkage behavior during the firing.

The present invention has been achieved on the basis of these findings, and a ceramic composition according to the present invention is characterized by containing 24 to 40 weight % of a B$_2$O$_3$—SiO$_2$—Al$_2$O$_3$-MO based glass composition (where M represents at least one of Ca, Mg, Sr, and Ba; B$_2$O$_3$: 4 to 17.5 weight %, SiO$_2$: 28 to 50 weight %, Al$_2$O$_3$: 0 to 20 weight %, and MO: 36 to 50 weight %), containing 46 to 75.4 weight % of at least one of SrTiO$_3$ and CaTiO$_3$, and containing 0.1 to 5.0 weight % of a Cu oxide calculated as CuO and 0.5 to 7.0 weight % of a Ca oxide calculated as CaO, and a metal oxide containing at least one selected from among Mn, Zn, and Co is 10 weight % or less (however, including 0 weight %) respectively, calculated as MnO, ZnO, and CoO. As the amount of 0% indicates, and as described later, the presence of Al$_2$O$_3$ in the glass composition is optional and the phrase "B$_2$O$_3$—SiO$_2$—Al$_2$O$_3$-MO based glass composition" should be read with that understanding.

In addition, a ceramic green sheet according to the present invention is characterized in that the ceramic composition is formed in the shape of a sheet.

A ceramic electronic component according to the present invention is characterized by including a first ceramic layer composed of a sintered body of the ceramic composition.

Another ceramic electronic component according to the present invention is characterized in that the first ceramic layer and a second ceramic layer with a specific dielectric constant lower than that of the first ceramic layer are stacked.

In addition, the ceramic electronic component according to the present invention is characterized in that the second ceramic layer is a sintered body of a ceramic composition containing 51 to 60 weight % of a ceramic powder and containing 40 to 49 weight % of a B$_2$O$_3$—SiO$_2$—Al$_2$O$_3$-MO based glass composition (where M represents at least one of Ca, Mg, Sr, and Ba; B$_2$O$_3$: 5 to 17.5 weight %, SiO$_2$: 28 to 44 weight %, Al$_2$O$_3$: 0 to 20 weight %, and MO: 36 to 50 weight %).

Further, a ceramic electronic component according to the present invention is characterized in that the ceramic powder is Al$_2$O$_3$.

In addition, a ceramic electronic component according to the present invention is characterized by including a conductor pattern containing Ag or Cu as its main constituent.

Advantageous Effect of the Invention

The ceramic composition described above contains 24 to 40 weight % of the B$_2$O$_3$—SiO$_2$—Al$_2$O$_3$-MO based glass composition compounded at a predetermined ratio of 46 to 75.4 weight % of at least one of SrTiO$_3$ and CaTiO$_3$, and 0.1 to 5.0 weight % of a Cu oxide in terms of CuO and 0.5 to 7.0 weight % of a Ca oxide in terms of CaO, where a metal oxide containing at least one selected from among Mn, Zn, and Co is 10 weight % or less (however, including 0 weight %) respectively in terms of MnO, in terms of ZnO, and in terms of CoO can be present, and thus can provide a ceramic composition which has improved dielectric properties while making it easier to control the shrinkage behavior of a ceramic sintered body during firing, and provide a ceramic composition which allows the achievement of a balance between the control of the shrinkage behavior and the dielectric properties.

Specifically, a ceramic composition can be obtained which has the properties of a specific dielectric constant ∈r of 40 or more, a Q value of 750 or more, and an insulation resistance log IR of 10 or more, and provides a shrinkage behavior easily controlled during firing, with favorable sinterability.

Therefore, high-quality ceramic green sheets and ceramic electronic components can be achieved which have favorable dielectric properties, so as to respond to the request of further reduction in size for module products, etc.

In one embodiment of the ceramic electronic component according to the present invention, a first ceramic layer and a second ceramic layer with a specific dielectric constant lower than that of the first ceramic layer are stacked. Thus, a further reduction in size for ceramic substrates is made possible by, for example, providing conductors for wiring in the second ceramic layer which is a low dielectric constant layer, and providing elements such as a capacitor and a filter in the first ceramic layer which is a high dielectric constant layer.

Since the ceramic composition constituting the first ceramic layer is similar in the constituent composition of the glass composition to the ceramic composition constituting the second ceramic layer, property fluctuations, property variations, etc. are less likely to be caused by interdiffusion during firing, and in addition, since the ceramic composition constituting the first ceramic layer and the ceramic composition constituting the second ceramic layer have coefficients of thermal expansion close to each other, structural defects such a delamination are less likely to be caused. Furthermore, the second ceramic layer has no need to contain any alkali metal element, and can be thus avoid reacting with a resistor constituting a resistive element to cause degradation of resistance characteristics.

BEST MODE FOR CARRYING OUT THE INVENTION

Figure 1:
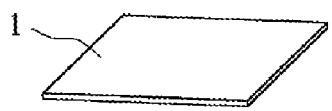
FIG. 1 is a perspective view of a ceramic green sheet according to the present invention.

Next, embodiments of the present invention will be described in detail.

The ceramic composition according to the present invention is prepared so as to contain (1) 24 to 40 weight % of a B$_2$O$_3$—SiO$_2$—Al$_2$O$_3$-MO based glass composition (i.e., a borosilicate based glass composition hereinafter referred to as simply a "glass composition"), (2) 46 to 75.4 weight % of at least one of SrTiO$_3$ and CaTiO$_3$, (3) 0.1 to 5.0 weight % of a Cu oxide and 0.5 to 7.0 weight % of a Ca oxide (hereinafter, referred to as a "first sintering aid constituent") in terms of CuO and in terms of CaO, respectively, and (4) 10 weight % or less (including 0 weight %) of an oxide containing at least one of Mn, Zn, and Co (hereinafter, referred to as a "second sintering aid constituent").

The element M in the glass composition refers to at least one of Ca, Mg, Sr, and Ba, and the glass composition is compounded so as to have a constituent composition of $B_2O_3$: 4 to 17.5 weight %, $SiO_2$: 28 to 50 weight %, $Al_2O_3$: 0 to 20 weight %, and MO: 36 to 50 weight %.

The ceramic composition according to the present invention, which has the constituent composition described above, can make it easier to control the shrinkage behavior of a ceramic sintered body during firing, and provide a ceramic composition which is excellent in reliability with a high specific dielectric constant ∈r and a high Q value so as to exhibit durability for a long period of time even in conditions of high temperature and humidity.

In particular, according to an approach using a constrained layer as described later therein, a ceramic sintered body subjected to firing can ensure a dimension accuracy of 99% or more in the X-Y direction with respect to a ceramic compact not subjected to firing and provide a ceramic composition which is excellent in reliability with a specific dielectric constant ∈r of 40 or more, a Q value of 750 or more, and an insulation resistance log IR of 10 or more even in the case of exposure for a long period of time to conditions of high temperature and humidity.

Next, the reason why the ceramic composition is mixed in the compositional component will be described.

(1) Glass Composition

The above-described glass composition contained in the ceramic composition allows firing at a low temperature of 1050° C. or less, in particular, around 900° C., when the content of the glass composition is at least 24 weight % or more. More specifically, if the content of the glass composition is reduced to less than 24 weight %, the fluidity of the glass will be reduced during firing, and the ceramic sintered body will be thus more likely to shrink. Moreover, the sinterability will be also decreased to possibly make it difficult to carry out sintering at low temperatures.

On the other hand, when the content of the glass composition is greater than 40 weight %, there is a possibility that the excessive content of the glass composition with a low specific dielectric constant will reduce the specific dielectric constant ∈r of the entire ceramic composition.

Therefore, the compositional component in the present embodiment is compounded so that the content of the glass composition is 24 to 40 weight %.

In addition, the constituents ($B_2O_3$, $SiO_2$, $Al_2O_3$, MO) in the glass composition are limited to the ranges mentioned above for the following reasons.

(a) $B_2O_3$

While $B_2O_3$ is added to lower the softening temperature and thus facilitate viscous flowing, an insufficient content of $B_2O_3$ of less than 4 weight % in the glass composition will increase the glass viscosity, thereby possibly leading to defective sintering. On the other hand, if the content of $B_2O_3$ in the glass composition is greater than 17.5 weight %, the chemical stability of the glass composition will be degraded, and as a result, the insulation resistance log IR will be possibly decreased in the case of exposure for a long period of time to conditions of high temperature and humidity, to damage the reliability.

Therefore, the compositional component in the present embodiment is compounded so that the content of $B_2O_3$ in the glass composition is 4 to 17.5 weight %, and preferably 5 to 10 weight %.

(b) $SiO_2$

While $SiO_2$ contributes to the stability of the glass composition, a content of $SiO_2$ less than 28 weight % in the glass composition will lead to degradation of the chemical stability, and as a result, there is a possibility that the insulation resistance will be decreased to damage the reliability in the case of exposure for a long period of time to conditions of high temperature and humidity. On the other hand, when the content of $SiO_2$ in the glass composition is greater than 50 weight %, there is a possibility that the excessive content will increase the glass viscosity, and as a result, lead to defective sintering.

Therefore, the compositional component in the present embodiment is compounded so that the content of $SiO_2$ in the glass composition is 28 to 50 weight %, and preferably 38 to 48 weight %.

(c) $Al_2O_3$

While $Al_2O_3$ is added, if necessary, to stabilize the glass composition, a content of $Al_2O_3$ greater than 20 weight % in the glass composition will possibly make crystallization difficult, thereby leading to a decrease in Q value.

Therefore, although it is not a problem if the glass composition contains no $Al_2O_3$ therein, the compositional component in the present embodiment is compounded so that the content of $Al_2O_3$ is 20 weight % or less, and preferably 4 to 10 weight %, when containing $Al_2O_3$.

(d) MO

While MO (M is Ca, Mg, Sr, and/or Ba) is added to lower the softening temperature and thus facilitate viscous flowing as in the case of $B_2O_3$, when the content of MO less than 36 weight % in the glass composition, the insufficient content will thus increase the glass viscosity, thereby possibly leading to defective sintering. On the other hand, if the content of MO in the glass composition is greater than 50 weight %, the chemical stability of the glass composition will be degraded, and as a result, the insulation resistance log IR will be possibly decreased to damage the reliability in the case of exposure for a long period of time in conditions of high temperature and humidity.

Therefore, the compositional component in the present embodiment is compounded so that the content of MO in the glass composition is 36 to 50 weight %, and more preferably 40 to 46 weight %.

In the present embodiment, the content of the entire glass composition is adapted to be 24 to 40 weight %, and the constituents of the glass constituent are adapted to have composition ranges of $B_2O_3$: 4 to 17.5 weight % (preferably 5 to 10 weight %), $SiO_2$: 28 to 50 weight % (preferably 38 to 48 weight %), $Al_2O_3$: 0 to 20 weight % (preferably 4 to 10 weight %), and MO: 36 to 50 weight % (40 to 46 weight %), so that desired effects may be produced in cooperation with the other additives.

(2) $SrTiO_3$ and $CaTiO_3$ $SrTiO_3$ and $CaTiO_3$ have respectively specific dielectric constants ∈r of 250 and 170. Since both have high specific dielectric constants ∈r, the adjustment of the compounding amounts for the $SrTiO_3$ and $CaTiO_3$ and the glass composition allows the specific dielectric constant ∈r to be increased while controlling the shrinkage behavior of the ceramic sintered body during firing.

However, if the content of $SrTiO_3$ and $CaTiO_3$ is less than 46 weight % in total, the relatively higher content of the glass composition can then suppress firing shrinkage, but possibly makes it impossible to achieve a sufficiently high desired specific dielectric constant ∈r.

On the other hand, if the content of $SrTiO_3$ and $CaTiO_3$ is greater than 75.4 weight % in total, the sinterability will be decreased, and there is a possibility that insufficient sintering will be caused when sintering is to be completed at a low temperature around 900° C., thereby leading to defective sintering.

Therefore, the composition is compounded in the present embodiment so that the content of $SrTiO_3$ and $CaTiO_3$ is 46 to 75.4 weight % in total, thereby achieving a balance between the control of the shrinkage behavior and the improvement of the dielectric properties.

(3) First Sintering Aid Constituent

While the glass composition itself generates a liquid phase to act as a sintering aid for promoting grain-grain sintering, the increased content of the glass composition makes it difficult, because of its low specific dielectric constant $\in$r, to obtain a ceramic composition with a desired high specific dielectric constant, even when SrTiO$_3$ or CaTiO$_3$ with a high specific dielectric constant $\in$r is added.

However, the addition of Cu oxide and Ca oxide to the glass composition can promote the liquid-phase sintering action of the glass composition, and thus, even when the content of the glass composition is controlled to 40 weight % or less, the addition of SrTiO$_3$ or CaTiO$_3$ allows the creation of a ceramic composition which can be obtained by low-temperature firing and has a high specific dielectric constant. Furthermore, for that purpose, the Cu oxide and the Ca oxide respectively need to be contained at 0.1 weight % or more in terms of CuO and at 0.5 weight % or more in terms of CaO.

If the Cu oxide and the Ca oxide are greater than 5.0 weight % in terms of CuO and greater than 7.0 weight % in terms of CaO, there is a possibility that a decrease in Q value will be caused.

Therefore, the composition in the present embodiment is compounded so that the content of the Cu oxide is 0.1 to 5.0 weight % in terms of CuO, whereas the Ca oxide is 0.5 to 7.0 weight % in terms of CaO.

(4) Second Sintering Aid Constituent

In addition to the first sintering aid constituent, the addition of a metal oxide containing at least one of Mn, Co, and Zn as a second sintering aid constituent also allows the specific dielectric constant $\in$r to be further improved.

If the respective constituents of the second sintering aid constituent are greater than 10 weight % in terms of MnO, in terms of CoO, and in terms of ZnO, there is a possibility that a decrease in Q value will occur, and a decrease in insulation resistance log IR occurs in the case of exposure for a long period of time to conditions of high temperature and humidity.

Therefore, while a desired specific dielectric constant $\in$r can be achieved without containing any second sintering aid constituent, the second sintering aid constituent (an Mn oxide, a Co oxide, and/or a Zn oxide) is allowed to be contained in the range of 10 weight % or less in terms of MnO, CoO, and ZnO in order to achieve a higher specific dielectric constant.

Next, a ceramic green sheet according to the present invention will be described.

FIG. 1 is a perspective view of a ceramic green sheet 1 obtained with the use of the ceramic composition described above.

This ceramic green sheet 1 can be produced easily in the following way.

More specifically, B$_2$O$_3$, SiO$_2$, Al$_2$O$_3$, MO (at least any one of CaO, BaO, SrO, and MgO), at least any one of SrTiO$_3$ and CaTiO$_3$, the first sintering aid constituent, and if necessary, the second sintering aid constituent are prepared, and weighed to provide a predetermined constituent composition. Then, the weighed materials are put into a ball mill along with a grinding medium such as PSZ (partially stabilized zirconia) balls, and subjected to mixing and grinding in a wet manner for a predetermined period of time. Then, the ground product is subjected to evaporative drying, and subjected to calcination at a predetermined temperature for about 2 hours to obtain a calcined powder (ceramic composition).

This calcined powder with appropriate amounts of binder, solvent, and plasticizer added thereto is subjected to wet grinding to form a slurry, and a forming process such as a doctor blade method is used to apply the forming process to the slurry, thereby allowing the preparation of ceramic green sheets formed to have a predetermined thickness.

The ceramic green sheets can be used to obtain various types of ceramic electronic components.

Figure 2:
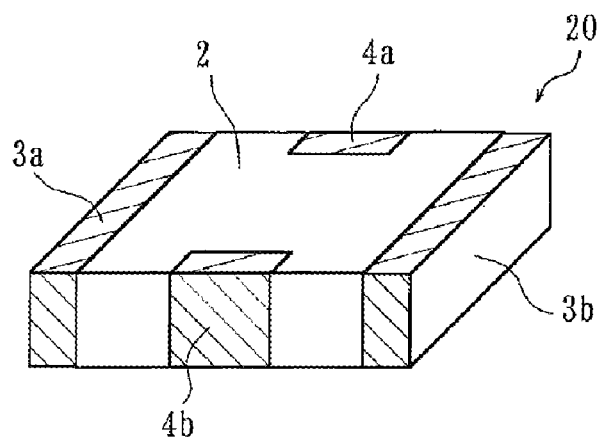
FIG. 2 is a perspective view illustrating a composite LC component as an embodiment (first embodiment) of a ceramic electronic component according to the present invention.

FIG. 2 is a perspective view of a laminated LC component 20, which shows an embodiment (first embodiment) of a ceramic electronic component.

Figure 3:
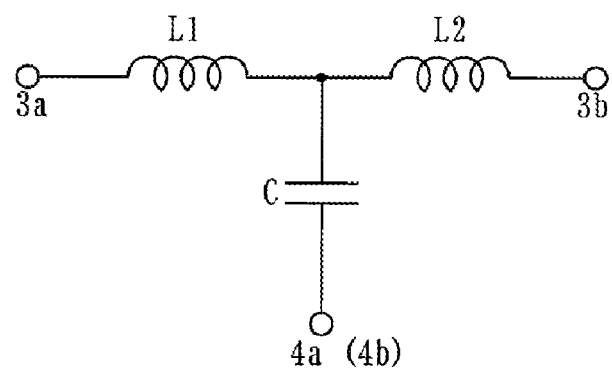
FIG. 3 is a circuit diagram illustrating an equivalent circuit of FIG. 2.

This laminated LC component 20 has a circuit formed for constituting inductance L and capacitance C in a ceramic sintered body 2. In addition, the ceramic sintered body 2 has external electrodes 3a, 3b formed on both ends, and has a substantially center section with external electrodes 4a, 4b formed thereon. The laminated LC component 20 thus has therein an LC resonant circuit formed of an equivalent circuit as shown in FIG. 3.

Figure 4:
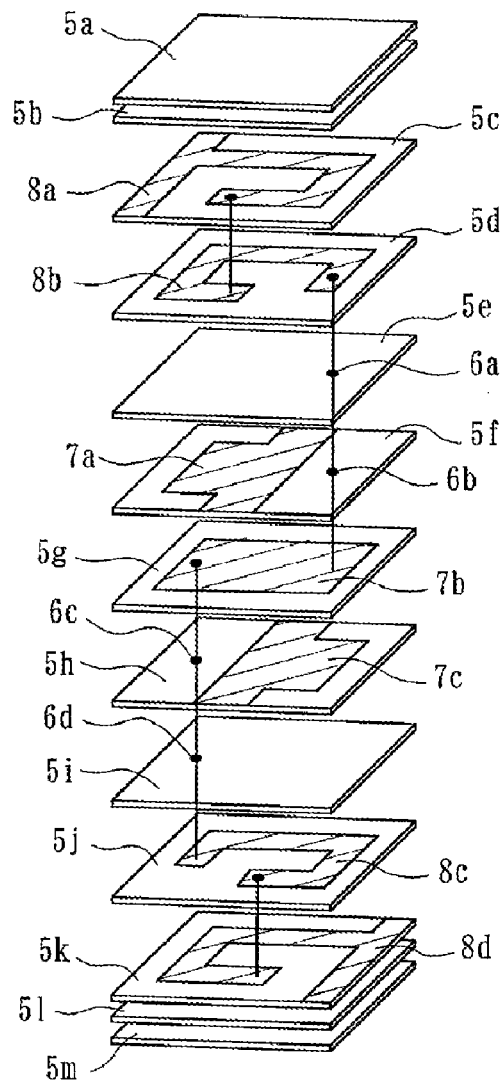
FIG. 4 is an exploded perspective view of a ceramic sintered body for the explanation of a production method for FIG. 2.

Next, a method for producing the laminated LC component 20 will be described with reference to FIG. 4.

First, rectangular ceramic green sheets 5a to 5m are produced in accordance with the method described above.

In order to make it possible to electrically connect the ceramic green sheets 5c to 5k to each other, a laser processing machine is used to form via holes 6a to 6d in predetermined positions of the ceramic green sheets 5c to 5k. Then, a conductive paste containing Ag or Cu as its main constituent is applied by screen printing to form conductor patterns 7a to 7c for a capacitor and conductor patterns 8a to 8d for coils.

Then, after filling the via holes 6a to 6d with a conductive paste, the ceramic green sheets 5c to 5k are stacked to electrically connect the conductor patterns 8a to 8d for coils into coiled forms, thereby forming coiled conductors, as well as to form a capacitance section including the conductor patterns 7a to 7c for a capacitor and the ceramic green sheets 5f to 5h.

The coiled conductors and capacitance section stacked are sandwiched by the ceramic green sheets 5a, 5b and ceramic green sheets 5l, 5m which have no conductor pattern formed thereon, and subjected to pressurization to produce a ceramic laminate.

Then, a constrained layer containing an inorganic material that is not sintered at the sintering temperature (for example, 900° C.) of the ceramic laminate (for example, a ceramic green sheet (alumina green sheet) containing alumina as its main constituent, which has a melting point of 1500° C. or more) is placed on at least one principal surface, the ceramic laminate with the constrained layer is subjected to firing, and the constrained layer is then removed. This thereby produces a ceramic sintered body 2. More specifically, the ceramic green sheets 5a to 5m obtained by sheet forming using the ceramic composition are sintered to each form ceramic layers with a high specific dielectric constant, and the conductor patterns 7a to 7c for a capacitor, the conductor patterns 8a to 8d for coils, and the via holes 6a to 6d are subjected to co-firing with the ceramic green sheets 5a to 5m to form internal electrodes, that is, internal electrodes for a capacitors, and coiled conductors.

Furthermore, since the constrained layer in the present embodiment is placed on at least one principal surface of the ceramic laminate, the constrained layer controls the shrinkage behavior of the ceramic laminate in the principal surface direction (XY direction), and as a result, a ceramic sintered body 2 can be obtained which has a high dimension accuracy and is less likely to cause warpage.

After this, the external electrodes 3a to 4b are formed by a thin film formation method such as application and firing of conductive paste, vapor deposition, plating, or sputtering. In this way, the laminated LC component 20 is produced.

As described above, the ceramic sintered body 2 in the first embodiment, which is formed from the ceramic composition, can be thus produced by co-firing at a low temperature even in the case of using a low melting point metal containing, as its main constituent, Ag or Cu as an internal electrode material. Furthermore, the laminated LC component 20 can be obtained which controls the shrinkage behavior of the ceramic sintered body 2, and also has excellent reliability with favorable dielectric properties with a high specific dielectric constant ∈r and a Q value.

Figure 5:
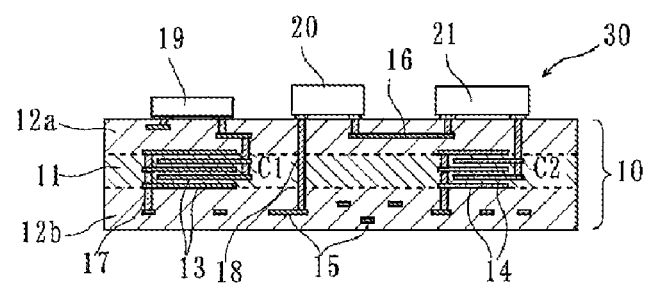
FIG. 5 is a cross-sectional view of a multilayer module as a second embodiment of a ceramic electronic component according to the present invention.

FIG. 5 is a cross-sectional view of a ceramic multilayer module 30, which schematically shows a second embodiment of a ceramic electronic component according to the present invention.

This ceramic multilayer module 30 has electronic component elements 19 to 21 on a ceramic multilayer substrate 10. It is to be noted examples of the electronic component elements 19 to 21 include semiconductor devices, chip-type laminated capacitors, etc.

The ceramic multilayer substrate 10 has a second group of ceramic layers 12a, 12b on both surfaces of a first group of ceramic layers 11 composed of sintered bodies of the ceramic composition, where the second group of ceramic layers 12a, 12b has a lower specific dielectric constant ∈r than the first group of ceramic layers 11.

The first group of ceramic layers 11 is composed of a plurality of stacked ceramic layers and internal electrodes 13, 14 are provided between the respective ceramic layers, thereby forming capacitor units C1, C2.

The second group of ceramic layers 12a, 12b and the first group of ceramic layers 11 have via holes 17, 18 and internal wirings 15, 16 formed appropriately as needed.

Furthermore, the via holes 17, 18 and the internal wirings 15, 16 electrically connect the electronic component elements 19 to 21 and the capacitor units C1, C2 to form the ceramic multilayer module 30.

In the second embodiment, the first group of ceramic layers 11 is formed from the above-described ceramic composition with a higher specific dielectric constant (hereinafter, referred to as a "first ceramic composition"), whereas the second group of ceramic layers 12a, 12b is formed from a second ceramic composition which has a lower specific dielectric constant ∈r than the first ceramic composition.

The second ceramic composition has a similar constituent composition to the first ceramic composition.

Specifically, the second ceramic composition contains 51 to 60 weight % of a ceramic powder, and contains 40 to 49 weight % of a $B_2O_3$—$SiO_2$—$Al_2O_3$-MO based glass composition (hereinafter referred to as "second glass composition").

In this case, the content of the second glass composition is 40 to 49 weight % for the following reasons.

If the content of the second glass composition is greater than 49 weight %, there is a possibility that crystallization of the glass will be excessively developed to cause strain in the second group of ceramic layers 12a, 12b subjected to firing. On the other hand, the content of the second glass composition is less than 40 weight %, the specific dielectric constant ∈r will not be able to be lowered sufficiently.

Therefore, the second ceramic composition in the present embodiment is compounded so that the second glass composition is adapted to amount to 40 to 49 weight %, whereas the rest is composed of the ceramic powder.

The second glass composition has the same constituent composition as that of the glass composition of the first ceramic composition, except that the lower limit for $B_2O_3$ is adapted to be 5 weight % and the upper limit for $SiO_2$ is adapted to be 44 weight %.

In this case, the lower limit for $B_2O_3$ is adapted to be 5 weight % because the Q value for the second group of ceramic layers 12a, 12b is not decreased, and the upper limit for $SiO_2$ is adapted to be 44 weight % because there is a possibility that the sinterability will be excessively improved to increase the specific dielectric constant ∈r excessively.

It is to be noted that $Al_2O_3$ is preferable as the ceramic powder.

In addition, as described above, when the second group of ceramic layers 12a, 12b with its specific dielectric constant ∈r lower than that of the first group of ceramic layers 11 is formed from the second ceramic composition which is similar to the first ceramic composition, property fluctuation, property variations, etc. become less likely to be caused by interdiffusion during firing. In addition, since the first ceramic composition and the second ceramic composition also have coefficients of thermal expansion which are close to each other, structural defects such a delamination are less likely to be caused. Furthermore, since the second group of ceramic layers 12a, 12b has no need to contain any alkali metal element in the case of including a resistive element, since the second group of ceramic layers can avoid reacting with a resistor constituting the resistive element to cause degradation of resistance characteristics.

In addition, when an external electrode for external connection is formed on the lower surface of the ceramic multilayer substrate, the ceramic laminated module 30 can be easily surface-mounted onto a printed circuit board, etc. by use of the lower surface side.

In the second embodiment, the use of the first and second ceramic compositions, which are suitable for low-temperature firing, thus allows low-resistance and inexpensive low melting point metals such as Ag and Cu to be used and subjected to co-firing to form the internal electrodes 13, 14 and internal wirings 15, 16 as well as the via holes 17, 18. More specifically, a co-firing type ceramic multilayer substrate can be used to constitute the capacitor units C1, C2, and the module can be reduced in size. In addition, the first group of ceramic layers 11 using the first ceramic composition described above thus has such a high specific dielectric constant ∈r and a high Q value that a ceramic multilayer module 30 can be obtained which has excellent reliability with favorable sinterability.

It is to be noted that for the ceramic multilayer substrate 10, firing with a constrained layer placed on at least any one principal surface of the second group of ceramic layers 12a, 12b, in the same way as in the first embodiment, can easily produce a ceramic sintered body with its shrinkage behavior controlled during the firing.

In addition, the internal electrodes 13, 14 which are adjacent to each other in the thickness direction for extracting the capacitance in the capacitor units C1, C2 are buried in the first group of ceramic layers 11, and thus, internal electrodes with relatively small areas can achieve high capacitance, thereby also promoting a reduction in size. More specifically, a further reduction in the size of the ceramic substrate is made possible by providing conductors for wiring on the second group of ceramic layers 12a which are low dielectric constant layers, and providing elements such as capacitors and filters in the first group of ceramic layers which are high dielectric constant layers.

It is to be noted that while the laminated LC component 20 and the ceramic multilayer module 30 has been described in the first and second embodiment, which are just examples, the present invention is not to be considered limited to the component and the module. More specifically, the present invention can be applied to various types of ceramic multilayer substrates such as ceramic multilayer substrates for multichip modules and ceramic multilayer substrates for hybrid ICs, or various ceramic electronic components with electronic component elements mounted on the ceramic multilayer substrates, and further various chip-type laminated electronic components such as chip-type laminated capacitors and chip-type laminated dielectric antennas.

Next, examples of the present invention will be described specifically.

Example 1

In Example 1, while keeping the respective contents of the glass composition, $SrTiO_3$, and the first sintering aid constituent (CuO and CaO) constant, samples with different constituent compositions for the glass composition were prepared, and evaluated for their properties.
Preparation of Samples
Preparation of Plain Substrate First, CaO, BaO, SrO, MgO, $Al_2O_3$, $SiO_2$, and $B_2O_3$ were prepared as glass raw materials. Then, the glass raw materials were weighed so as to provide the contents of glass compositions as shown in Table 1.

$SrTiO_3$, CuO, and $CaCO_3$ were prepared. Then, the glass composition, $SrTiO_3$, CuO, and $CaCO_3$ were weighed in such a way that the content of the glass composition is 36 weight %, the content of $SrTiO_3$ is 56 weight %, the content of CuO is 3.0 weight %, and the content of $CaCO_3$ is 5.0 weight % in terms of CaO.

These weighed materials were put into a ball mill along with a zirconia grinding medium, and mixed for 16 hours in a wet manner to prepare a calcined powder (ceramic composition).

Next, this ceramic composition with appropriate amounts of binder, solvent, and plasticizer added thereto was subjected to wet mixing and grinding in a ball mill for 2 hours to form a slurry, and a doctor blade method was used to apply a forming process to the slurry, thereby providing ceramic green sheets of sample numbers 1 to 19 with a thickness of 25 µm.

Then the ceramic green sheets were stacked to prepare a ceramic laminate, a constrained layer of an alumina green sheet was further placed on both surfaces of the ceramic laminate, and the ceramic laminate with the constrained layers was subjected to pressure bonding to prepare a pressure-bonded body of 55 mm in length, 75 mm in width, and 1 mm in thickness.

After this, a firing treatment was carried out at a firing temperature of 870° C. for 10 minutes under the atmosphere, and the constrained layers were then removed to prepare ceramic sintered bodies (plain substrates) of sample numbers 1 to 19 with a thickness of 0.65 mm.

Preparation of Laminated Ceramic Capacitor First, an Ag Paste containing Ag as its main constituent was prepared. Then, the Ag paste was applied by screen printing on the surfaces of the ceramic green sheets described above to form conductor patterns. Next, the ceramic green sheets with the conductor patterns were stacked so as to allow the acquisition of capacitance, and further sandwiched between the ceramic green sheets with no conductor patterns, thereby preparing a ceramic laminate. Then, a constrained layer was placed on both surfaces of the ceramic laminate to prepare a pressure-bonded body.

The pressure-bonded body was subjected to a firing treatment at a firing temperature of 870° C. for 10 minutes under the air atmosphere, and the constrained layers were then removed to prepare a ceramic sintered body with internal electrodes buried.

Then, an Ag paste containing Ag as its main constituent was prepared, applied to both ends of the ceramic sintered body, and subjected to firing at a temperature of 800° C. to form external electrodes, thereby preparing laminated ceramic capacitors sample numbers 1 to 19. The laminated ceramic capacitors prepared had external dimensions of 8 mm in length, 6 mm in width, and 0.5 mm in thickness, the effective number of stacked layers was 3, and the effective area per electrode was 4 $mm^2$.
Evaluations of Samples The respective samples (plain substrates) of sample numbers 1 to 19 were evaluated for the sinterability and shrinkage behavior during the firing.

Specifically, a red ink was dropped onto the samples for the evaluation of sinterability, and the samples stained with the red ink were determined as defectives in sintering (indicated by an "x") in the Table.

The shrinkage behavior was evaluated by calculating the shrinkage ratio in the following way. The vertical and horizontal lengths of the ceramic laminate before sintering and the vertical and horizontal lengths of the ceramic sintered body after sintering were measured to calculate the vertical shrinkage ratio and the horizontal shrinkage ratio in accordance with the following formulas (1), (2), and then calculate the shrinkage ratio in accordance with the formula (3).

Vertical Shrinkage Ratio=(Vertical Length after Sintering/Vertical Length before Sintering)×100     (1)

Horizontal Shrinkage Ratio=(Horizontal Length after Sintering/Horizontal Length before Sintering)×100     (2)

Shrinkage Ratio=(Vertical Shrinkage Ratio+Horizontal Shrinkage Ratio)/2     (3)

In addition, the specific dielectric constant ∈r and the Q value were measured at a resonant frequency 6 GHz. It is to be noted that the samples with the specific dielectric constant ∈r of 40 or more and the Q value of 750 or more were determined as non-defective products.

In addition, a PCT (pressure cooker test) was carried out to evaluate reliability. More specifically, a direct-current voltage of 10 V was applied to the samples at a temperature of 120° C. and a relative humidity of 85%. After 192 hours, the insulation resistance log IR was measured with a resistance meter, and the samples with the insulation resistance log IR of 10 or more were determined as non-defective products.

Table 1 shows the constituent compositions of the glass compositions for each sample, and Table 2 shows the ceramic compositions and measurement results for each sample.

TABLE 1

| Sample No. | Constituent Compositions of Glass Compositions | | | | | | |
|---|---|---|---|---|---|---|---|
| | CaO | BaO | SrO | MgO | $Al_2O_3$ | $SiO_2$ | $B_2O_3$ |
| G1 | 43.6 | — | — | — | 6.8 | 43.4 | 6.2 |
| G2 | — | 43.6 | — | — | 6.8 | 43.4 | 6.2 |
| G3 | — | — | 43.6 | — | 6.8 | 43.4 | 6.2 |
| G4 | — | — | — | 43.6 | 6.8 | 43.4 | 6.2 |
| G5* | 35.0 | — | — | — | 7.8 | 50.0 | 7.1 |
| G6 | 38.0 | — | — | — | 7.5 | 47.7 | 6.8 |
| G7 | 48.0 | — | — | — | 6.3 | 40.0 | 5.7 |
| G8* | 55.0 | — | — | — | 5.4 | 34.6 | 5.0 |

TABLE 1-continued

| Sample No. | Constituent Compositions of Glass Compositions | | | | | | |
|---|---|---|---|---|---|---|---|
| | CaO | BaO | SrO | MgO | Al$_2$O$_3$ | SiO$_2$ | B$_2$O$_3$ |
| G9* | 45.6 | — | — | — | 7.1 | 45.3 | 2.0 |
| G10 | 44.2 | — | — | — | 6.9 | 44.0 | 4.9 |
| G11 | 39.0 | — | — | — | 6.1 | 38.9 | 16.0 |
| G12* | 37.2 | — | — | — | 5.8 | 37.0 | 20.0 |
| G13* | 52.0 | — | — | — | 11.9 | 26.0 | 10.1 |
| G14 | 50.0 | — | — | — | 10.4 | 30.0 | 9.6 |
| G15 | 40.1 | — | — | — | 6.2 | 48.0 | 5.7 |
| G16* | 36.2 | — | — | — | 5.6 | 53.0 | 5.2 |
| G17 | 46.8 | — | — | — | 0.0 | 46.6 | 6.6 |
| G18 | 37.4 | — | — | — | 20.0 | 37.3 | 5.3 |
| G19* | 32.7 | — | — | — | 30.0 | 32.6 | 4.7 |

*outside the scope of the present invention was degraded due to the high CaO content of 52.0 weight % and the low SiO$_2$ content of 26.0 weight % in the glass composition.

There was defective sintering in the case of sample number 16. This is believed to be because the glass viscosity was increased due to the high SiO$_2$ content of 53.0 weight % in the glass composition.

There was a decrease in Q value to 550 in the case of sample number 19. This is believed to be because the high Al$_2$O$_3$ content of 30.0 weight % in the glass composition made crystallization difficult while improving the stability of the glass, thereby leading to the decrease in Q value.

In contrast to these samples, the constituent compositions of the glass compositions fall within the scope of the present invention in the case of sample numbers 1 to 4, 6, 7, 10, 11, 14, 15, 17, and 18, and moreover, the content of 36 weight % for

TABLE 2

| Sample No. | Glass Composition No. | SrTiO$_3$ weight % | First Sintering Aid Constituent | | Specific Dielectric Constant ∈r | Q Value | logIR | Shrinkage Ratio (%) | Sinterability |
|---|---|---|---|---|---|---|---|---|---|
| | | | CuO (weight %) | CaO (weight %) | | | | | |
| 1 | G1 | 36.0 | 56.0 | 3.0 | 5.0 | 42.3 | 758 | 12.3 | 99.89 | ○ |
| 2 | G2 | 36.0 | 56.0 | 3.0 | 5.0 | 42.5 | 757 | 12.8 | 99.90 | ○ |
| 3 | G3 | 36.0 | 56.0 | 3.0 | 5.0 | 41.9 | 774 | 13.6 | 99.88 | ○ |
| 4 | G4 | 36.0 | 56.0 | 3.0 | 5.0 | 42.0 | 780 | 13.0 | 99.91 | ○ |
| 5* | G5 | 36.0 | 56.0 | 3.0 | 5.0 | — | — | — | 99.91 | x |
| 6 | G6 | 36.0 | 56.0 | 3.0 | 5.0 | 40.1 | 760 | 11.5 | 99.92 | ○ |
| 7 | G7 | 36.0 | 56.0 | 3.0 | 5.0 | 44.5 | 846 | 10.9 | 99.91 | ○ |
| 8* | G8 | 36.0 | 56.0 | 3.0 | 5.0 | 46.5 | 915 | 4.8 | 99.87 | ○ |
| 9* | G9 | 36.0 | 56.0 | 3.0 | 5.0 | — | — | — | 99.90 | x |
| 10 | G10 | 36.0 | 56.0 | 3.0 | 5.0 | 41.8 | 770 | 12.8 | 99.88 | ○ |
| 11 | G11 | 36.0 | 56.0 | 3.0 | 5.0 | 46.0 | 830 | 11.0 | 99.79 | ○ |
| 12* | G12 | 36.0 | 56.0 | 3.0 | 5.0 | 47.0 | 862 | 4.8 | 99.82 | ○ |
| 13* | G13 | 36.0 | 56.0 | 3.0 | 5.0 | 48.7 | 930 | 4.8 | 99.91 | ○ |
| 14 | G14 | 36.0 | 56.0 | 3.0 | 5.0 | 45.9 | 855 | 11.0 | 99.85 | ○ |
| 15 | G15 | 36.0 | 56.0 | 3.0 | 5.0 | 41.0 | 777 | 43.4 | 99.88 | ○ |
| 16* | G16 | 36.0 | 56.0 | 3.0 | 5.0 | — | — | — | 99.90 | x |
| 17 | G17 | 36.0 | 56.0 | 3.0 | 5.0 | 46.0 | 840 | 13.0 | 99.79 | ○ |
| 18 | G18 | 36.0 | 56.0 | 3.0 | 5.0 | 41.9 | 750 | 12.8 | 99.83 | ○ |
| 19* | G19 | 36.0 | 56.0 | 3.0 | 5.0 | 40.5 | 550 | 14.1 | 99.78 | ○ |

*outside the scope of the present invention

In the case of sample number 5, there was defective sintering. This is believed to be because the glass viscosity was increased due to the low CaO content of 35.0 weight % in the glass composition.

It has been determined that in the case of sample number 8, reliability degradation was caused due to its low insulation resistance log IR of 4.8 after the PCT. This is believed to be because the chemical stability of the glass composition was degraded due to the high CaO content of 55.0 weight % in the glass composition.

In the case of sample number 9, there was defective sintering. This is believed to be because the glass viscosity was increased due to the low B$_2$O$_3$ content of 2.0 weight % in the glass composition.

It has been determined that in the case of sample number 12, reliability degradation was caused due to its low insulation resistance log IR of 4.8 after the PCT. This is believed to be because the chemical stability of the glass composition was degraded due to the high B$_2$O$_3$ content of 20.0 weight % in the glass composition.

It has been determined that in the case of sample number 13, reliability degradation was caused due to its low insulation resistance log IR of 4.8 after the PCT. This is believed to be because the chemical stability of the glass composition the glass composition, the content of 56 weight % for SrTiO$_3$, the content of 3.0 weight % for CuO, and the content of 5.0 weight % for CaO in the ceramic composition each fall within the scope of the present invention. It has been determined for these samples that the sinterability is favorable, and in addition, the shrinkage behavior during firing can also be suppressed with the shrinkage ratio of not less than 99%. Furthermore, it has been also determined that desired favorable dielectric properties can be achieved with the specific dielectric constant ∈r of not less than 40 and the Q value of not less than 750, and moreover, the reliability can be also ensured with the insulation resistance log IR of not less than 10 after the PCT.

Example 2

In Example 2, samples with different contents for the glass composition, SrTiO$_3$, and the first sintering aid constituent (CuO and CaO) were prepared while keeping the constituent composition for the glass composition constant, and evaluated for their properties.

Preparation of Samples

B$_2$O$_3$, SiO$_2$, Al$_2$O$_3$, and CaO were prepared as glass raw materials, and SrTiO$_3$, CuO, and CaCO$_3$ were prepared as additives (fillers) other than the glass raw materials.

Then, the glass raw materials were weighed so as to provide the content of the glass composition corresponding to sample number G1 (within the scope of the present invention) in Table 1, and the additive raw materials were weighed so as to provide the contents of the ceramic compositions in total as shown in Table 3. It is to be noted that $CaCO_3$ was weighed so as to provide the contents shown in Table 3 in terms of CaO.

After that, plain substrates and laminated ceramic capacitors of sample numbers 21 to 53 were prepared in accordance with the same method and procedure as in the case of Example 1.

Table 3 shows the constituent compositions for sample numbers 21 to 53.

TABLE 3

| Sample No. | Glass Composition No. | Glass Composition weight % | SrTiO₃ (weight %) | First Sintering Aid Constituent | |
|---|---|---|---|---|---|
| | | | | CuO (weight %) | CaO (weight %) |
| 21* | G1 | 20.0 | 79.4 | 0.1 | 0.5 |
| 22* | G1 | 20.0 | 72.0 | 3.0 | 5.0 |
| 23* | G1 | 20.0 | 68.0 | 5.0 | 7.0 |
| 24 | G1 | 24.0 | 75.4 | 0.1 | 0.5 |
| 25 | G1 | 24.0 | 68.0 | 3.0 | 5.0 |
| 26 | G1 | 24.0 | 64.0 | 5.0 | 7.0 |
| 27 | G1 | 28.0 | 64.0 | 3.0 | 5.0 |
| 28 | G1 | 32.0 | 60.0 | 3.0 | 5.0 |
| 29* | G1 | 36.0 | 63.5 | — | 0.5 |
| 30* | G1 | 36.0 | 59.0 | — | 5.0 |
| 31* | G1 | 36.0 | 54.0 | — | 10.0 |
| 32 | G1 | 36.0 | 63.4 | 0.1 | 0.5 |
| 33 | G1 | 36.0 | 58.9 | 0.1 | 5.0 |
| 34* | G1 | 36.0 | 63.4 | 0.5 | 0.1 |
| 35 | G1 | 36.0 | 63.0 | 0.5 | 0.5 |
| 36 | G1 | 36.0 | 62.5 | 0.5 | 1.0 |
| 37 | G1 | 36.0 | 58.5 | 0.5 | 5.0 |
| 38 | G1 | 36.0 | 56.5 | 0.5 | 7.0 |
| 39* | G1 | 36.0 | 53.5 | 0.5 | 10.0 |
| 40 | G1 | 36.0 | 60.5 | 3.0 | 0.5 |
| 41 | G1 | 36.0 | 60.0 | 3.0 | 1.0 |
| 42 | G1 | 36.0 | 56.0 | 3.0 | 5.0 |
| 43 | G1 | 36.0 | 54.0 | 3.0 | 7.0 |
| 44* | G1 | 36.0 | 51.0 | 3.0 | 10.0 |
| 45 | G1 | 36.0 | 58.5 | 5.0 | 0.5 |
| 46 | G1 | 36.0 | 52.0 | 5.0 | 7.0 |
| 47* | G1 | 36.0 | 50.0 | 7.0 | 7.0 |
| 48 | G1 | 40.0 | 59.4 | 0.1 | 0.5 |
| 49 | G1 | 40.0 | 52.0 | 3.0 | 5.0 |
| 50 | G1 | 40.0 | 48.0 | 5.0 | 7.0 |
| 51* | G1 | 44.0 | 55.4 | 0.1 | 0.5 |
| 52* | G1 | 44.0 | 48.0 | 3.0 | 5.0 |
| 53* | G1 | 44.0 | 44.0 | 5.0 | 7.0 |

*outside the scope of the present invention

Evaluations of Samples

The respective samples of sample numbers 21 to 53 were evaluated for sinterability, and evaluated for shrinkage behavior in accordance with the same method as in the case of Example 1.

In accordance with the same methods as in the case of Example 1, the specific dielectric constant ∈r and the Q value were measured, and the PCT test was further carried out to evaluate the reliability.

The criteria for evaluation are all the same as in the case of Example 1.

Table 4 shows the measurement results.

TABLE 4

| Sample No. | Specific Dielectric Constant ∈r | Q Value | logIR | Shrinkage Ratio (%) | Sinterability |
|---|---|---|---|---|---|
| 21* | — | — | — | 98.24 | X |
| 22* | — | — | — | 98.14 | X |
| 23* | — | — | — | 98.60 | X |
| 24 | 40.3 | 758 | 11.1 | 99.38 | ○ |
| 25 | 41.4 | 768 | 11.5 | 99.46 | ○ |
| 26 | 42.6 | 762 | 11.8 | 99.58 | ○ |
| 27 | 53.8 | 836 | 11.5 | 99.48 | ○ |
| 28 | 52.5 | 876 | 11.9 | 99.66 | ○ |
| 29* | 32.4 | 667 | 11.2 | 99.44 | ○ |
| 30* | 28.4 | 584 | 11.1 | 99.58 | ○ |
| 31* | 24.7 | 531 | 12.1 | 99.61 | ○ |
| 32 | 40.5 | 754 | 11.5 | 99.41 | ○ |
| 33 | 41.5 | 776 | 12.2 | 99.53 | ○ |
| 34* | 34.8 | 702 | 11.8 | 99.62 | ○ |
| 35 | 43.8 | 764 | 12.2 | 99.62 | ○ |
| 36 | 41.3 | 784 | 11.2 | 99.52 | ○ |
| 37 | 43.5 | 789 | 11.2 | 99.35 | ○ |
| 38 | 42.8 | 778 | 10.8 | 99.27 | ○ |
| 39* | 38.2 | 524 | 11.4 | 99.18 | ○ |
| 40 | 40.2 | 767 | 10.6 | 99.28 | ○ |
| 41 | 40.8 | 769 | 11.5 | 99.47 | ○ |
| 42 | 42.5 | 788 | 12.1 | 99.87 | ○ |
| 43 | 42.8 | 807 | 12.4 | 99.76 | ○ |
| 44* | 36.4 | 538 | 11.1 | 99.91 | ○ |
| 45 | 44.5 | 807 | 11.4 | 99.81 | ○ |
| 46 | 40.8 | 794 | 11.2 | 99.62 | ○ |
| 47* | 40.2 | 584 | 11.9 | 99.58 | ○ |
| 48 | 46.8 | 806 | 11.6 | 99.83 | ○ |
| 49 | 49.2 | 828 | 12.1 | 99.96 | ○ |
| 50 | 48.8 | 839 | 12.1 | 99.92 | ○ |
| 51* | 32.5 | 604 | 8.2 | 99.82 | ○ |
| 52* | 35.2 | 628 | 9.4 | 99.91 | ○ |
| 53* | 34.8 | 618 | 9.8 | 99.92 | ○ |

*outside the scope of the present invention

In sample numbers 21 to 23, the shrinkage ratio was worsened to 98.14 to 98.60, and were not more than 99.0%. This is believed to be because due to the low content of 20 weight % for the glass composition, the fluidity of the glass was decreased during the firing, thereby making the ceramic sintered body more likely to shrink. In addition, the low content of the glass composition of 20 weight % made the firing at the low temperature of 870° C. difficult, thus resulting in defective sintering.

In the case of sample numbers 29 to 31, it has been determined that desired dielectric properties were not achieved, with the specific dielectric constant ∈r being 24.7 to 32.4, which is not more than 40, and also with the Q value of 531 to 667, which is not more than 750, due to containing no CuO while containing CaO.

In the case of sample number 34, it has been determined that the desired high specific dielectric constant was not able to be achieved, with the specific dielectric constant ∈r of 34.8 due to the insufficient CaO content of 0.1 weight %.

In the case of sample numbers 39 and 44, it has been determined that the specific dielectric constant ∈r and the Q value were decreased due to the excessive CaO content of 10.0 weight %.

In the case of sample number 47, it has been determined that sufficiently high Q values were not achieved, with the low Q value of 584 due to the excessive CuO content of 7.0 weight %.

In the case of sample numbers 51 to 53, it has been determined that the desired high specific dielectric constants are not able to be achieved, with the low specific dielectric constant ∈r of 32.5 to 35.2 for the ceramic composition due to the high content of 44 weight % for the glass composition with a lower specific dielectric constant ∈r. In addition, it has been determined that the low Q value not more than 750 was provided.

In contrast to these samples, the content of the glass composition from 24 to 40 weight %, the content of SrTiO$_3$ from 48 to 75.4 weight %, the content of CuO from 0.1 to 5.0 weight %, and the content of CaO from 0.5 to 7.0 weight % each fall within the scope of the present invention in the case of sample numbers 24 to 28, 32, 33, 35 to 38, 40 to 43, 45, 46, and 48 to 50. For these samples, the sinterability is favorable, and in addition, the shrinkage behavior during firing can also be suppressed with the shrinkage ratio of not less than 99%. Furthermore, it has been also determined that desired favorable dielectric properties can be achieved with the specific dielectric constant ∈r of not less than 40 and the Q value of not less than 750, and moreover, the reliability can be also ensured with the insulation resistance log IR of not less than 10 after the PCT test.

Example 3

In Example 3, while keeping the constituent composition for the glass composition and the content of the first sintering aid constituent (CuO and CaO) constant, samples with different contents for the glass the second sintering aid constituent (MnO, CoO, or ZnO) were prepared, and evaluated for their properties.

Preparation of Samples

B$_2$O$_3$, SiO$_2$, Al$_2$O$_3$, and CaO were prepared as glass raw materials, and SrTiO$_3$, CuO, CaCO$_3$, MnCO$_3$, CoO, and ZnO were prepared as additives (fillers), i.e., non-glass raw materials.

Then, the glass raw materials were weighed so as to provide a glass composition corresponding to sample number G1 (within the scope of the present invention) in Table 1, and the additive raw materials were weighed so as to provide the contents of the ceramic compositions in total as shown in Table 5. It is to be noted that CaCO$_3$ and MnCO$_3$ were weighed so as to provide the contents shown in Table 5 in terms of CaO and in terms of MnO.

After that, plain substrates and laminated ceramic capacitors of sample numbers 61 to 75 were prepared in accordance with the same method and procedure as in the case of Example 1.

Table 5 shows the constituent compositions for sample numbers 61 to 75.

TABLE 5

| Sample No. | Glass Composition No. | Glass weight % | SrTiO$_3$ (weight %) | First Sintering Aid Constituent | | Second Sintering Aid Constituent | | |
|---|---|---|---|---|---|---|---|---|
| | | | | CuO (weight %) | CaO (weight %) | MnO (weight %) | CoO (weight %) | ZnO (weight %) |
| 61* | G1 | 36.0 | 59.0 | — | — | 5.0 | — | — |
| 62* | G1 | 36.0 | 59.0 | — | — | — | 5.0 | — |
| 63* | G1 | 36.0 | 59.0 | — | — | — | — | 5.0 |
| 64  | G1 | 36.0 | 55.0 | 3.0 | 5.0 | 1.0 | — | — |
| 65  | G1 | 36.0 | 51.0 | 3.0 | 5.0 | 5.0 | — | — |
| 66  | G1 | 36.0 | 46.0 | 3.0 | 5.0 | 10.0 | — | — |
| 67* | G1 | 36.0 | 41.0 | 3.0 | 5.0 | 15.0 | — | — |
| 68  | G1 | 36.0 | 55.0 | 3.0 | 5.0 | — | 1.0 | — |
| 69  | G1 | 36.0 | 51.0 | 3.0 | 5.0 | — | 5.0 | — |
| 70  | G1 | 36.0 | 46.0 | 3.0 | 5.0 | — | 10.0 | — |
| 71* | G1 | 36.0 | 41.0 | 3.0 | 5.0 | — | 15.0 | — |
| 72  | G1 | 36.0 | 55.0 | 3.0 | 5.0 | — | — | 1.0 |
| 73  | G1 | 36.0 | 51.0 | 3.0 | 5.0 | — | — | 5.0 |
| 74  | G1 | 36.0 | 46.0 | 3.0 | 5.0 | — | — | 10.0 |
| 75* | G1 | 36.0 | 41.0 | 3.0 | 5.0 | — | — | 15.0 |

*outside the scope of the present invention

Evaluations of Samples

The respective samples of sample numbers 61 to 75 were evaluated for sinterability, and evaluated for shrinkage behavior in accordance with the same method as in the case of Example 1.

In addition, in accordance with the same methods as in the case of Example 1, the specific dielectric constant ∈r and the Q value were measured, and the PCT test was further carried out to evaluate the reliability of the respective samples.

The criteria for evaluation are all the same as in the case of Example 1.

Table 6 shows the measurement results.

TABLE 6

| Sample No. | Specific Dielectric Constant ∈r | Q Value | logIR | Shrinkage Ratio (%) | Sinterability |
|---|---|---|---|---|---|
| 61* | 36.8 | 622 | 12.1 | 99.61 | ◯ |
| 62* | 32.4 | 561 | 11.2 | 99.71 | ◯ |
| 63* | 35.8 | 608 | 12.4 | 99.84 | ◯ |
| 64  | 42.5 | 781 | 11.2 | 99.68 | ◯ |
| 65  | 43.2 | 762 | 11.4 | 99.79 | ◯ |
| 66  | 43.8 | 764 | 11.1 | 99.82 | ◯ |
| 67* | 42.8 | 678 | 7.6  | 99.85 | ◯ |
| 68  | 40.5 | 818 | 10.8 | 99.52 | ◯ |
| 69  | 43.5 | 826 | 11.6 | 99.78 | ◯ |
| 70  | 44.8 | 817 | 12.1 | 99.81 | ◯ |
| 71* | 41.2 | 728 | 6.2  | 99.88 | ◯ |
| 72  | 46.2 | 761 | 11.2 | 99.86 | ◯ |

TABLE 6-continued

| Sample No. | Specific Dielectric Constant ∈r | Q Value | logIR | Shrinkage Ratio (%) | Sinterability |
|---|---|---|---|---|---|
| 73 | 50.2 | 818 | 11.8 | 99.82 | ○ |
| 74 | 52.5 | 830 | 12.2 | 99.91 | ○ |
| 75* | 44.8 | 758 | 6.0 | 99.82 | ○ |

*outside the scope of the present invention

In the case of sample numbers 61 to 63, it has been determined that the specific dielectric constant ∈r and the Q value were decreased due to the absence of a first sintering aid constituent (CuO and CaO) while containing 5 weight % of each second sintering aid constituent. More specifically, it has been confirmed that the first sintering aid constituent is indispensable for the composition system according to the present invention.

In addition, it has been confirmed that the insulation resistance log IR in the case of sample numbers 67, 71, and 75 was decreased extremely to 6.0 to 7.6 when they were left for a long period of time under conditions of high temperature and humidity, due to the low content of 41 weight % for $SrTiO_3$ and the excessive content of 15 weight % for MnO, CoO, or ZnO although containing 3.0 weight % of CuO and 5.0 weight % of CaO within the scope of the present invention.

In contrast to these samples, the content of $SrTiO_3$ from 46.0 to 55.0 weight % and the content of the second sintering aid constituent from 1.0 to 10.0 weight % in the case of sample numbers 64 to 66, 68 to 70, and 72 to 74 fall within the scope of the present invention. Thus, it has been determined for these samples that the sinterability is favorable, and in addition, the shrinkage behavior during firing can also be suppressed with a shrinkage ratio of not less than 99%. Furthermore, it has been also determined that desired favorable dielectric properties can be achieved with a specific dielectric constant ∈r of not less than 40 and a Q value of not less than 750, and moreover, the reliability can be also ensured with the insulation resistance log IR of not less than 10 after the PCT test.

In particular, when the sample of sample number 1 (Table 2) containing no second sintering aid constituent is compared with sample numbers 64 to 66, 68 to 70, and 72 to 74, it is determined that the specific dielectric constant ∈r can be further improved in the case of containing 5 to 10 weight % of the second sintering aid constituent in addition to the first sintering aid constituent, as compared with the case containing no second sintering aid constituent.

Example 4

In Example 4, $CaTiO_3$ was used in place of $SrTiO_3$ to prepare various types of samples and evaluate their properties.

Preparation of Samples $B_2O_3$, $SiO_2$, $Al_2O_3$, and CaO were prepared as glass raw materials, and $CaTiO_3$, CuO, $CaCO_3$, $MnCO_3$, CoO, and ZnO were prepared as non-glass additives (fillers) raw materials.

Then, the glass raw materials were weighed so as to provide a content of the glass composition corresponding to sample number G1 (within the scope of the present invention) in Table 1, and the additive raw materials were weighed so as to provide the contents of the ceramic compositions in total as shown in Table 7. It is to be noted that $CaCO_3$ and $MnCO_3$ were weighed so as to provide the contents shown in Table 7 in terms of CaO and in terms of MnO.

After that, plain substrates and laminated ceramic capacitors of sample numbers 81 to 98 were prepared in accordance with the same method and procedure as in the case of Example 1.

Table 7 shows the constituent compositions for sample numbers 81 to 98.

TABLE 7

| Sample No. | Glass Composition No. | Glass weight % | CaTiO₃ (weight %) | First Sintering Aid Constituent | | Second Sintering Aid Constituent | | |
|---|---|---|---|---|---|---|---|---|
| | | | | CuO (weight %) | CaO (weight %) | MnO (weight %) | CoO (weight %) | ZnO (weight %) |
| 81* | G1 | 20.0 | 72.0 | 3.0 | 5.0 | — | — | — |
| 82 | G1 | 24.0 | 75.4 | 0.1 | 0.5 | — | — | — |
| 83 | G1 | 24.0 | 68.0 | 3.0 | 5.0 | — | — | — |
| 84 | G1 | 24.0 | 64.0 | 5.0 | 7.0 | — | — | — |
| 85 | G1 | 28.0 | 64.0 | 3.0 | 5.0 | — | — | — |
| 86 | G1 | 32.0 | 60.0 | 3.0 | 5.0 | — | — | — |
| 87 | G1 | 36.0 | 63.4 | 0.1 | 0.5 | — | — | — |
| 88 | G1 | 36.0 | 56.0 | 3.0 | 5.0 | — | — | — |
| 89 | G1 | 36.0 | 51.0 | 3.0 | 5.0 | 5.0 | — | — |
| 90 | G1 | 36.0 | 51.0 | 3.0 | 5.0 | — | 5.0 | — |
| 91 | G1 | 36.0 | 51.0 | 3.0 | 5.0 | — | — | 5.0 |
| 92 | G1 | 36.0 | 52.0 | 5.0 | 7.0 | — | — | — |
| 93 | G1 | 40.0 | 59.4 | 0.1 | 0.5 | — | — | — |
| 94 | G1 | 40.0 | 52.0 | 3.0 | 5.0 | — | — | — |
| 95 | G1 | 40.0 | 48.0 | 5.0 | 7.0 | — | — | — |
| 96* | G1 | 44.0 | 55.4 | 0.1 | 0.5 | — | — | — |
| 97* | G1 | 44.0 | 48.0 | 3.0 | 5.0 | — | — | — |
| 98* | G1 | 44.0 | 44.0 | 5.0 | 7.0 | — | — | — |

*outside the scope of the present invention

Evaluations of Samples

The respective samples numbers 81 to 98 were evaluated for sinterability, and evaluated for shrinkage behavior in accordance with the same method as in the case of Example 1.

In addition, in accordance with the same methods as in the case of [Example 1], the specific dielectric constant ∈r and the Q value were measured, and the PCT test was further carried out to evaluate the reliability for the respective samples.

The criteria for evaluation are all the same as in the case of Example 1.

Table 8 shows the measurement results.

TABLE 8

| Sample No. | Specific Dielectric Constant ∈r | Q Value | logIR | Shrinkage Ratio (%) | Sinterability |
|---|---|---|---|---|---|
| 81* | — | — | — | 98.18 | X |
| 82 | 48.4 | 771 | 11.4 | 99.32 | ○ |
| 83 | 53.8 | 848 | 12.1 | 99.33 | ○ |
| 84 | 53.3 | 822 | 11.1 | 99.82 | ○ |
| 85 | 54.8 | 836 | 12.4 | 99.92 | ○ |
| 86 | 52.4 | 833 | 12.1 | 99.94 | ○ |
| 87 | 44.8 | 808 | 12.4 | 99.96 | ○ |
| 88 | 53.6 | 814 | 12.2 | 99.96 | ○ |
| 89 | 52.8 | 811 | 11.8 | 99.93 | ○ |
| 90 | 51.6 | 806 | 11.7 | 99.94 | ○ |
| 91 | 52.2 | 784 | 12.4 | 99.93 | ○ |
| 92 | 48.4 | 771 | 11.9 | 99.91 | ○ |
| 93 | 47.8 | 792 | 12.0 | 99.94 | ○ |
| 94 | 50.8 | 818 | 12.4 | 99.93 | ○ |
| 95 | 47.2 | 762 | 11.4 | 99.94 | ○ |
| 96* | 30.8 | 579 | 9.8 | 99.88 | ○ |
| 97* | 34.8 | 627 | 9.7 | 99.81 | ○ |
| 98* | 34.1 | 618 | 9.2 | 99.79 | ○ |

*outside the scope of the present invention

In the case of sample number 81, the fluidity of the glass was decreased during the firing due to the low content of 20 weight % for the glass composition to make the ceramic sintered body more likely to shrink, as in the case of sample numbers 21 to 23 (Tables 3, 4), and worsen the shrinkage ratio to 98.18%, i.e., not more than 99%. In addition, the difficulty with firing at the low temperature of 870° C. caused defective firing.

In the case of sample numbers 96 to 98, it has been determined that desired high specific dielectric constants were not achieved, with a low specific dielectric constant ∈r of 30.8 to 34.8 for the ceramic composition, as in the case of sample numbers 51 to 53 (Table 3 and Table 4), due to the high content of 44 weight % for the glass composition with a lower specific dielectric constant ∈r.

In contrast to these samples, the content in the case of sample numbers 82 to 95, of the glass composition from 24 to 40 weight %, the content of CaTiO₃ from 48 to 75.4 weight %, the content of CuO from 0.1 to 5.0 weight %, and the content of CaO from 0.5 to 7.0 weight % each fall within the scope of the present invention. Thus, it has been determined for these samples that the sinterability is favorable, and in addition, the shrinkage behavior during firing can also be suppressed with the shrinkage ratio of not less than 99%. Furthermore, it has been also determined that desired favorable dielectric properties can be achieved with the specific dielectric constant ∈r of not less than 40 and the Q value of not less than 750, and moreover, the reliability can be ensured with the insulation resistance log IR of not less than 10 after the PCT test.

In addition, when sample number 88 containing no first sintering aid constituent is compared with sample numbers 89 to 91 containing the second sintering aid constituent, it is seen that desired high specific dielectric constants not less than 40 can be ensured, while the specific dielectric constant ∈r has a tendency to decrease slightly due to the second sintering aid constituent present.

As described above, it has been determined that ceramic electronic components are achieved which have favorable sinterability, is also capable of suppressing the shrinkage behavior during firing, and moreover have desired properties, even when CaTiO₃ was used in place of SrTiO₃.

INDUSTRIAL APPLICABILITY

The present invention can achieve a balance between a suppressed shrinkage behavior of the ceramic sintered body during the firing and a high specific dielectric constant, is preferable for firing at low temperatures, and can be used for ceramic electronic components such as ceramic multilayer substrates and LC components.

DESCRIPTION OF REFERENCE SYMBOLS

1 ceramic green sheet
2 ceramic sintered body
5a~5m ceramic green sheet
7a~7c conductor pattern
8a~8d conductor pattern
11 first group of ceramic layers (first ceramic layer)
12a, 12b second group of ceramic layers (second ceramic layer)
13 internal electrode (conductor pattern)
14 internal electrode (conductor pattern)
15 internal wiring (conductor pattern)
16 internal wiring (conductor pattern)

The invention claimed is:

1. A ceramic composition comprising
   24 to 40 weight % of a $B_2O_3$—$SiO_2$-MO based glass composition in which M represents at least one member selected from the group consisting of Ca, Mg, Sr, and Ba, and in which the $B_2O_3$ is 4 to 17.5 weight %, the $SiO_2$ is 28 to 50 weight %, the and the MO is 36 to 50 weight %, and in which the glass composition contains 0 to 20 weight % of $Al_2O_3$;
   46 to 75.4 weight % of at least one of $SrTiO_3$ and $CaTiO_3$;
   0.1 to 5.0 weight % of a Cu oxide in terms of CuO;
   0.5 to 7.0 weight % of a Ca oxide in terms of CaO; and
   up to 10 weight % of metal oxide in which the metal is at least one member selected from the group consisting of Mn, Zn, and Co, respectively in terms of MnO, ZnO, and CoO.

2. A ceramic composition according to claim 1 in which the glass contains 5 to 10 weight % $B_2O_3$, 38 to 48 weight % $SiO_2$, 4 to 10 weight % $Al_2O_3$, and 40 to 46 weight % MO.

3. A ceramic composition according to claim 2 in which M comprises Ca, and $SrTiO_3$ is present.

4. A ceramic composition according to claim 3 in which the amount of $SrTiO_3$ and $CaTiO_3$ is 48 to 68 weight %; each of the Cu oxide and Ca oxide are at least 0.5 weight %, and at least one of the Mn, Zn, and Co metal oxides is absent.

5. A ceramic composition according to claim 4 in which at least one of the Mn, Zn, and Co metal oxides is present in an amount of at least 1 weight percent.

6. A ceramic composition according to claim 1 disposed in the shape of a sheet.

7. A ceramic electronic component comprising a first ceramic layer comprising a sintered body of the ceramic composition according to claim 1.

8. The ceramic electronic component according to claim 7 having a second ceramic layer stacked on a first ceramic layer, wherein the second ceramic layer has a lower specific dielectric constant than that of the first ceramic layer.

9. The ceramic electronic component according to claim 8 wherein the second ceramic layer is a sintered body of a ceramic composition comprising 51 to 60 weight % of a ceramic powder and 40 to 49 weight % of a second $B_2O_3$—

$SiO_2$-MO based glass composition in which M is at least one member selected from the group consisting of Ca, Mg, Sr, and Ba, and in which the $B_2O_3$ is 5 to 17.5 weight %, the $SiO_2$ is 28 to 44 weight %, and the MO is 36 to 50 weight %, and in which the glass composition contains 0 to 20 weight % of $Al_2O_3$.

10. The ceramic electronic component according to claim 9 wherein the second ceramic layer ceramic powder is $Al_2O_3$.

11. The ceramic electronic component according to claim 10, further comprising a conductor pattern comprising Ag or Cu as its main constituent.

12. The ceramic electronic component according to claim 9, further comprising a conductor pattern comprising Ag or Cu as its main constituent.

13. The ceramic electronic component according to claim 8, further comprising a conductor pattern comprising Ag or Cu as its main constituent.

14. The ceramic electronic component according to claim 7, further comprising a conductor pattern comprising Ag or Cu as its main constituent.

15. The ceramic electronic component according to claim 8 in which the glass contains 5 to 10 weight % $B_2O_3$, 38 to 48 weight % $SiO_2$, 4 to 10 weight % $Al_2O_3$, and 40 to 46 weight % MO.

16. The ceramic electronic component according to claim 15 wherein M comprises Ca, and $SrTiO_3$ is present.

17. The ceramic electronic component according to claim 15 in which the amount of $SrTiO_3$ and $CaTiO_3$ is 48 to 68 weight %; each of the Cu oxide and Ca oxide are at least 0.5 weight %, and at least one of the Mn, Zn, and Co metal oxides is absent.

18. The ceramic electronic component according to claim 17 wherein the second ceramic layer is a sintered body of a ceramic composition comprising 51 to 60 weight % of a ceramic powder and 40 to 49 weight % of a second $B_2O_3$—$SiO_2$-MO based glass composition in which M is at least one member selected from the group consisting of Ca, Mg, Sr, and Ba, and in which the $B_2O_3$ is 5 to 17.5 weight %, the $SiO_2$ is 28 to 44 weight %, the $Al_2O_3$ is 0 to 20 weight %, and the MO is 36 to 50 weight %, and in which the second glass composition contains 0 to 20 weight % of $Al_2O_3$.

19. The ceramic electronic component according to claim 8 wherein the second ceramic layer ceramic powder is $Al_2O_3$.

20. The ceramic electronic component according to claim 19, further comprising a conductor pattern comprising Ag or Cu as its main constituent.

* * * * *